(12) United States Patent
Kameya

(10) Patent No.: US 10,038,421 B2
(45) Date of Patent: Jul. 31, 2018

(54) COMMON MODE FILTER

(71) Applicant: MATSUE ELMEC CORPORATION, Matsue-shi, Shimane (JP)

(72) Inventor: Masaaki Kameya, Matsue (JP)

(73) Assignee: ELMEC CORPORATION, Yamato-Shi (JP)

(*) Notice: Subject to any disclaimer, the term of this patent is extended or adjusted under 35 U.S.C. 154(b) by 0 days.

(21) Appl. No.: 15/311,918

(22) PCT Filed: May 27, 2014

(86) PCT No.: PCT/JP2014/063956
§ 371 (c)(1),
(2) Date: Nov. 17, 2016

(87) PCT Pub. No.: WO2015/181883
PCT Pub. Date: Dec. 3, 2015

(65) Prior Publication Data
US 2017/0092417 A1    Mar. 30, 2017

(51) Int. Cl.
| | |
|---|---|
| *H03H 7/06* | (2006.01) |
| *H03H 7/42* | (2006.01) |
| *H01F 27/40* | (2006.01) |
| *H01F 27/28* | (2006.01) |
| *H03H 1/00* | (2006.01) |

(52) U.S. Cl.
CPC ......... *H03H 7/427* (2013.01); *H01F 27/2804* (2013.01); *H01F 27/40* (2013.01); *H03H 7/06* (2013.01); *H03H 2001/0085* (2013.01)

(58) Field of Classification Search
CPC .. H03H 2001/0085; H03H 7/06; H03H 7/427; H01F 27/2804

USPC ................ 333/4, 5, 175, 185, 181; 336/200
See application file for complete search history.

(56) References Cited

U.S. PATENT DOCUMENTS

2009/0303652 A1    12/2009  Tallam et al.

FOREIGN PATENT DOCUMENTS

| JP | 2000-60107 A | 2/2000 |
| JP | 2001-231268 A | 8/2001 |
| JP | 2004-165448 A | 6/2004 |
| JP | 2009-10729 A | 1/2009 |

(Continued)

OTHER PUBLICATIONS

International Search Report dated Sep. 2, 2014, issued in counterpart International Application No. PCT/JP2014/063956 (2 pages).

*Primary Examiner* — Rakesh Patel
(74) *Attorney, Agent, or Firm* — Westerman, Hattori, Daniels & Adrian, LLP

(57) ABSTRACT

A common mode filter suppressing a reflection of a common mode noise and sufficiently removing the common mode noise of 2 GHz or less includes: a signal coil spirally formed in a dielectric layer of a multilayer structure, and serially inserted and connected to one of the differential signal lines; a signal coil inserted and connected to the other differential signal line and formed in the dielectric layer so as to face the signal coil through the dielectric layer; a control coil formed in the dielectric layer so as to be sandwiched between the first and second signal coils interposing the dielectric layer and wound in the same direction as the signal coil; and an embedded resistor connected to at least one of an outer peripheral end or an inner peripheral end of the control coil, thus forming a feedback loop circuit by the control coil and the embedded resistor.

10 Claims, 19 Drawing Sheets

(56) References Cited

FOREIGN PATENT DOCUMENTS

| | | |
|---|---|---|
| JP | 2009-194957 A | 8/2009 |
| JP | 2011-119492 A | 6/2011 |
| WO | 2011/052374 A1 | 5/2011 |

# COMMON MODE FILTER

TECHNICAL FIELD

The present invention relates to a common mode filter, and particularly to a new common mode filter capable of suppressing a reflection of a common mode noise and adjusting a common mode removing characteristic.

DESCRIPTION OF RELATED ART

Conventionally, a common mode choke coil is generally used as an electronic component for removing a common mode noise on a transmission line for an ultra-high-speed differential signal.

Although the conventional common mode choke coil hardly allows an ultra-high-speed differential signal of a GHz band to pass under an influence of a magnetic loss of a magnetic material, the common mode choke coil realizing 10 GHz or more pass band for the differential signal has been commercialized.

The principle of removing the common mode noise of the common mode choke coil is as follows: a high series impedance is formed for a common mode signal by utilizing magnetic coupling, and the common mode noise is reflected to an input side and not allowed to be propagated to an output side.

In a device with a low frequency and hardly making a transmission line serve as an antenna pattern, a noise is unlikely to be radiated from such a pattern, and therefore only a conductive noise may be removed. Accordingly, there are less problems even if the noise is reflected using such a technique.

However, in a device for transmitting an ultra-high-speed differential signal of the GHz band, the transmission line is likely to be the antenna pattern, and therefore malfunction of its own circuit is likely to occur due to a radiation noise generated from its own circuit pattern.

Therefore, in the transmission of the ultra-high-speed differential signal of the GHz band, it is not preferable to reflect the noise by using the common mode choke coil.

In order to cope with such a problem, patent document 1 (Japanese Patent Publication No. 5341201) and patent document 2 (Japanese Patent Laid Open Publication No. 2009-10729) disclose a common mode filter for the purpose of suppressing a noise reflection.

The common mode filter disclosed in patent document 1, is configured as follows: by inserting resistors between a differential signal balance point of a differential delay line and a ground terminal, the resistors are not visible from the differential signal, on the other hand, a common mode signal passes though the resistors and absorbed and attenuated during returning to a ground.

In contrast, a common mode filter disclosed in patent document 2 is based on a concept that by having a distributed constant type configuration, the noise is absorbed and attenuated.

Each configuration is characterized by having the ground terminal and allowing the common mode noise to escape to a ground of the device.

PRIOR ART DOCUMENT

Patent Document

Patent document 1: Japanese Patent Publication No. 5341201 (WO2011/052374)

Patent document 2: Japanese Patent Laid Open Publication No. 2009-10729

DISCLOSURE OF THE INVENTION

Problem to be Solved by the Invention

However, the common mode filter disclosed in patent document 1 involves a problem that the common mode signal of a low frequency passes through a differential delay line.

For example, when the common mode filter is designed to obtain a sufficient removal of the noise at a clock frequency of 5 GHz for 10 Gbits/second transmission, such a common mode filter has a characteristic that a capability of removing the common mode noise is rapidly deteriorated at 2 GHz or less, and is hardly used when there is a peripheral circuit that operates at frequency of 2 GHz or less and when removing the noise that comes flying from there.

In contrast, although the common mode filter disclosed in patent document 2 is capable of sufficiently removing the common mode noise of 2 GHz or less, it doesn't have a noise absorption capability as disclosed in patent document 1, even when being designed to obtain a sufficient noise removing capability at 5 GHz.

The common mode filter based on patent document 2, is analyzed by modeling it for 10 Gbits/second transmission using an electromagnetic simulator, and the characteristic thereof is shown in FIG. 19. In FIG. 19, reference numeral Scc11 indicates a reflection characteristic of the common mode signal, and reference numeral Scc21 indicates a transmission characteristic of the common mode signal.

From FIG. 19, it is found that an attenuation amount is almost 0 dB in the vicinity of 5 GHz where Scc21 is minimum, and the removed common mode signal is totally reflected. Namely, it is found that the reflection of the common mode noise cannot be suppressed as expected even with a configuration of patent document 2.

In order to solve such a problem, the present invention is provided, and an object of the present invention is to provide the common mode filter capable of suppressing the reflection of the common mode noise and sufficiently removing the common mode noise of 2 GHz or less.

SUMMARY OF THE INVENTION

Means for Solving the Problem

In order to solve such a problem, a common mode filter according to a first aspect of the present invention includes:

a first signal coil spirally formed in a dielectric layer of a multilayer structure, and serially inserted and connected to a differential signal line of one polarity;

a second signal coil spirally formed in the dielectric layer so as to be superimposed on the first signal coil in a thickness direction and so as to face the first signal coil interposing the dielectric layer, and serially inserted and connected to a differential signal line of the other polarity;

a first control coil spirally formed in the dielectric layer so as to be sandwiched between the first and second signal coils interposing the dielectric layer, and wound in the same direction as the first signal coil, and configured to control magnetic coupling between the first and second signal coils; and a first embedded resistor formed in the dielectric layer and connected to at least one of an outer peripheral end or an inner peripheral end of the first control coil, thus forming a first feedback loop circuit via the first control coil and the first embedded resistor.

The common mode filter according to a second aspect of the present invention has a configuration in which a first feedback loop circuit is formed in the dielectric layer via the first control coil and the first embedded resistor.

The common mode filter according to a third aspect of the present invention has a configuration in which the outer peripheral end of the first control coil is connected to a first external terminal directly or via the first embedded resistor, the first external terminal being connected to an external feedback circuit for forming the first feedback loop circuit, and the inner peripheral end of the first control coil is connected to a second external terminal directly or via another first embedded resistor, the second external terminal being connected to the external feedback circuit, thus forming the first feedback loop circuit via these first external terminal and second external terminal.

A common mode filter according to a fourth aspect of the present invention includes:

a first signal coil spirally formed in a dielectric layer of a multilayer structure, and serially inserted and connected to a differential signal line of one polarity;

a second signal coil spirally formed in the dielectric layer so as to be superimposed on the first signal coil in a thickness direction and so as to face the first signal coil interposing the dielectric layer, and serially inserted and connected to a differential signal line of the other polarity;

a second control coil spirally formed in the dielectric layer so as to face the first signal coil interposing the dielectric layer on an opposite side to the second signal coil, and wound in the same direction as the first signal coil, and configured to control magnetic coupling between the first and second signal coils;

a third control coil spirally formed in the dielectric layer so as to face the second signal coil interposing the dielectric layer on the opposite side to the first signal coil, and wound in the same direction as the first signal coil, and configured to control magnetic coupling between the first and second signal coils;

a second embedded resistor formed in the dielectric layer, and connected to at least one of an outer peripheral end or an inner peripheral end of the second control coil; and a third embedded resistor formed in the dielectric layer, and connected to at least one of an outer peripheral end or an inner peripheral end of the third control coil, thus forming a second feedback loop circuit via these second control coil and second embedded resistor, and forming a third feedback loop circuit via these third control coil and third embedded resistor.

The common mode filter according to a fifth aspect of the present invention has a configuration in which the second feedback loop circuit is formed in the dielectric layer via these second control coil and second embedded resistor, and the third feedback loop circuit is formed in the dielectric layer via these third control coil and third embedded resistor.

The common mode filter according to a sixth aspect of the present invention has a configuration in which the outer peripheral end of the second control coil is connected to a second external terminal directly or via the second embedded resistor, the second external terminal being connected to an external feedback circuit for forming the second feedback loop circuit, and the inner peripheral end of the second control coil is connected to a third external terminal directly or via another second embedded resistor, the third external terminal being connected to the external feedback circuit, thus forming a second feedback loop circuit via these second and third external terminals, and the outer peripheral end of the third control coil is connected a fourth external terminal directly or via a third embedded resistor, the fourth external terminal being connected to an external feedback circuit for forming the third feedback loop circuit, and the inner peripheral end of the third control coil is connected to a fifth external terminal directly or via another third embedded resistor, the fifth external terminal being connected to the external feedback circuit, thus forming a third feedback loop circuit via these fourth and fifth external terminals.

A common mode filter according to a seventh aspect of the present invention includes:

a first signal coil spirally formed in a dielectric layer of a multilayer structure, and serially inserted and connected to a differential signal line of one polarity;

a second signal coil spirally formed in the dielectric layer so as to be superimposed on the first signal coil in a thickness direction and so as to face the first signal coil interposing the dielectric layer, and serially inserted and connected to a differential signal line of the other polarity;

a fourth control coil spirally formed in the dielectric layer so as to face the first signal coil interposing the dielectric layer on an opposite side to the second signal coil, and wound in the same direction as the first signal coil, and configured to control magnetic coupling between the first and second signal coils;

a fifth control coil formed in the dielectric layer so as to face the second signal coil interposing the dielectric layer on an opposite side to the first signal coil, and wound in the same direction as the first signal coil, and configured to control magnetic coupling between these first and second signal coils; and a fourth embedded resistor formed in the dielectric layer, and connected to at least one of an outer peripheral end or an inner peripheral end of these fourth and fifth control coils, wherein the fourth and fifth control coils are connected in parallel, thus forming a fourth feedback loop circuit via the fourth embedded resistor.

The common mode filter according to an eighth aspect of the present invention has a configuration in which a fourth feedback loop circuit is formed in the dielectric layer via the fourth control coil, the fifth control coil, and the fourth embedded resistor.

A common mode filter according to a ninth aspect of the present invention includes:

a first signal coil spirally formed in a dielectric layer of a multilayer structure, and serially inserted and connected to a differential signal line of one polarity;

a second signal coil spirally formed in the dielectric layer so as to be superimposed on the first signal coil in a thickness direction and so as to face the first signal coil interposing the dielectric layer, and serially inserted and connected to a differential signal line of the other polarity;

a sixth control coil spirally formed in the dielectric layer so as to sandwich the first or second signal coil and so as to face the first or the second signal coil interposing the dielectric layer, and wound in the same direction as the first signal coil, and configured to control magnetic coupling between the first and second signal coils; and a fifth embedded resistor formed in the dielectric layer and connected to a plurality of sixth control coils, wherein the plurality of sixth control coils are connected in parallel, thus forming a fifth feedback loop circuit via the fifth embedded resistor.

The common mode filter according to a tenth aspect of the present invention has a configuration in which a fifth feedback loop circuit is formed in a dielectric layer via a plurality of sixth control coils and fifth embedded resistors.

Advantage of the Invention

In the common mode filter according to claim 1 of the present invention, the first and second single coils serially inserted and connected to the differential signal line, are spirally formed in the dielectric layer of a multilayer structure so as to be superimposed on each other in the thickness direction, and the first control coil is spirally formed in the dielectric layer so as to be sandwiched between these first and second signal coils interposing the dielectric layer, and the first embedded resistor is disposed in the dielectric layer so as to be connected to at least one of the outer peripheral end or the inner peripheral end of the first control coil, thus forming the first feedback loop circuit via these first control coil and first embedded resistor. Therefore, in the configuration including the first and second signal coils and the first control coil, the magnetic coupling between the first and second signal coils can be controlled by the first control coil, and the reflection of a common mode noise can be suppressed, and the common mode noise of 2 GHz or less can be sufficiently removed.

In the common mode filter according to claim 2 of the present invention, the first feedback loop circuit is formed in the dielectric layer by the first control coil and the first embedded resistor. Therefore, an external connecting configuration can be simplified.

In the common mode filter according to claim 3 of the present invention, the outer peripheral end and the inner peripheral end of the first control coil are connected to the first and second external terminals directly or via the first embedded resistor, the first and second external terminals being connected to the external feedback circuit for forming the first feedback loop circuit, thus forming the first feedback loop circuit via these first and second external terminals. Therefore, the magnetic coupling between the first and second signal coils is controlled over a wider range via the external first feedback loop circuit, and the reflection of the common mode noise can be suppressed, and the common mode noise of 2 GHz or less can be removed.

In the common mode filter according to claim 4 of the present invention, the first and second signal coils serially inserted and connected to the differential signal line, are spirally formed in the dielectric layer of a multilayer structure so as to be superimposed on each other in the thickness direction, and the second control coil is spirally formed in the dielectric layer so as to face the first signal coil interposing the dielectric layer, and the third control coil is spirally formed in the dielectric layer so as to face the second signal coil interposing the dielectric layer, thus forming the second and third feedback loop circuits via the second and third control coils and the second and the third embedded resistors. Therefore, according to such a configuration including the first and second signal coils and the second and third control coils, the magnetic coupling between the first and second signal coils is controlled by the second and third control coils, and the reflection of the common mode noise is suppressed, and the common mode noise of 2 GHz or less can be removed, in a state in which an excellent magnetic coupling is maintained between the first and second signal coils.

In the common mode filter according to claim 5 of the present invention, the second and third feedback loop circuits are formed in the dielectric layer via these second and third control coils and the second and third embedded resistors. Therefore, an external connecting configuration is simplified.

In the common mode filter according to claim 6 of the present invention, the outer peripheral end and the inner peripheral end of the second and third control coils are connected to the second and third external terminals directly or via the second and third embedded resistors, the second and third external terminals being connected to the external feedback circuit for forming the second and third feedback loop circuit, thus forming the second and third feedback loop circuit via these second and third external terminals. Therefore, the magnetic coupling between the first and second signal coils is controlled over a wider range via the external second and third feedback loop circuits, and the reflection of the common mode noise can be suppressed, and the common mode noise of 2 GHz or less can be removed.

In the common mode filter according to claim 7 of the present invention, the first and second signal coils serially inserted and connected to the differential signal line, are spirally formed in the dielectric layer of a multilayer structure so as to be superimposed on each other in the thickness direction, and the fourth control coil is spirally formed in the dielectric layer so as to face the first signal coil interposing the dielectric layer, and the fifth control coil is spirally formed in the dielectric layer so as to face the second signal coil interposing the dielectric layer, and these fourth and fifth control coils are connected in parallel, thus forming the fourth feedback loop circuit via the fourth embedded resistor. Therefore, the magnetic coupling between the first and second signal coils is controlled by the fourth and fifth control coils, and the reflection of the common mode noise is suppressed, and the common mode noise of 2 GHz or less can be sufficiently removed, in a state in which excellent magnetic coupling is maintained between the first and second signal coils.

In the common mode filter according to claim 8 of the present invention, the fourth feedback loop circuit can be formed in the dielectric layer in the configuration including the first and second signal coils and fourth and fifth control coils. Therefore the external connecting configuration is simplified.

DETAILED DESCRIPTION OF THE INVENTION

Embodiments of the present invention will be described hereafter, with reference to the drawings.

Figure 1:
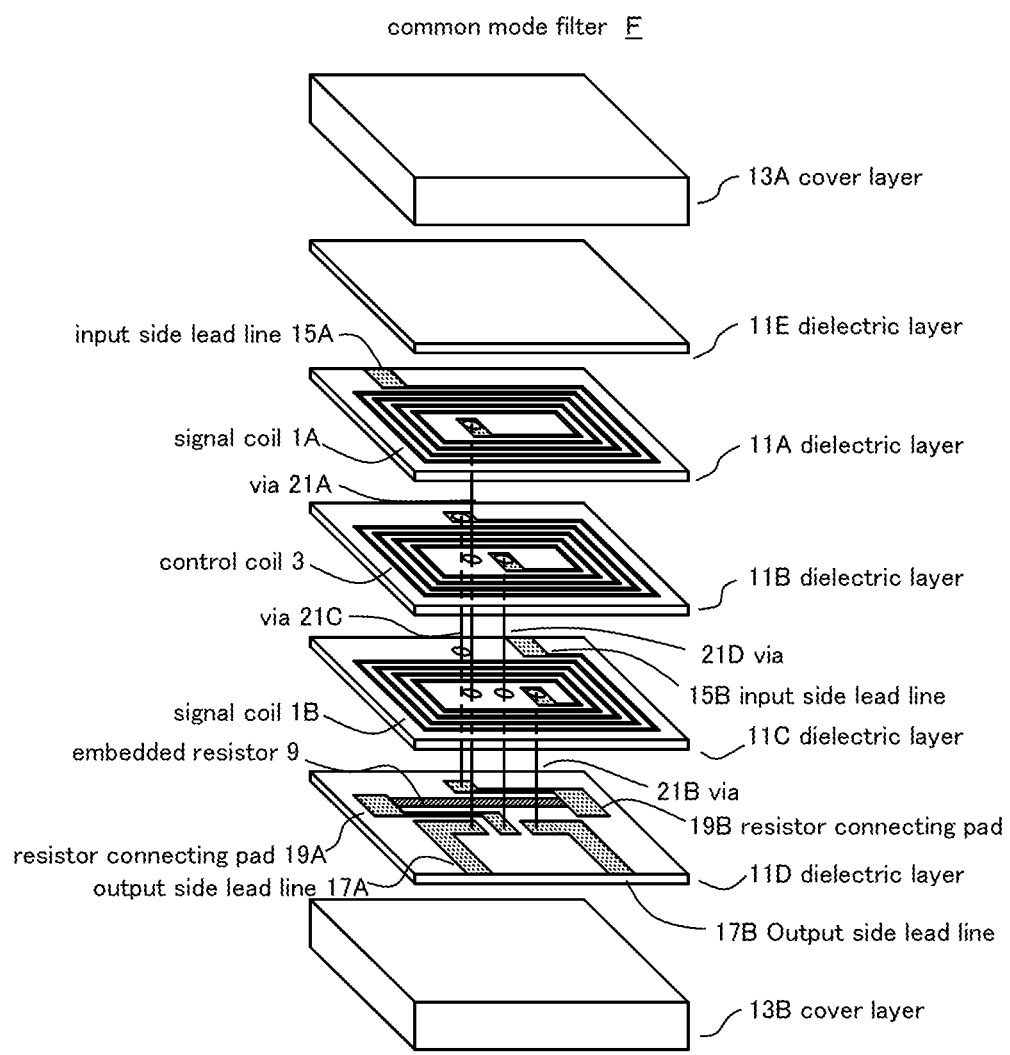
FIG. 1 is an exploded perspective view showing a basic configuration of a common mode filter according to the present invention.

FIG. 1 is an exploded perspective view showing a basic configuration of a common mod filter F according to the present invention.

A signal coil (first signal coil) 1A is formed in a dielectric layer 11A, a signal coil (second signal coil) 1B is formed in a dielectric layer 11C, and a control coil (first control coil) 3 is formed in a dielectric layer 11B, respectively.

These dielectric layers 11A to 11C are composed of a publicly-known laminated ceramic or a multilayer resin substrate having substantially the same shape such as a rectangular thin plate, and are laminated so as to sandwich the dielectric layer 11B between the dielectric layer 11A and the dielectric layer 11C.

These signal coils 1A, 1B, and control coil 3 are made of a publicly-known conductive material and spirally formed on one surface of each layer of the dielectric layers 11A to 11C by thin film photolithography, thick film printing or etching, etc., and the control coil 3 is sandwiched between the signal coil 1A and the signal coil 1B in a thickness direction of the dielectric layers 11A to 11C.

In addition, the control coil 3 is disposed just in a middle of the signal coil 1A and the signal coil 1B in the thickness direction.

The signal coils 1A and 1B are spirally formed in the same winding direction, the same line width, and the same line space, and are disposed so that line portions excluding both end portions are overlapped on each other within an error tolerance of print shift or laminating misalignment, when viewed from the thickness direction. Namely, the signal coils 1A and 1B are wired so that the line portions are almost overlapped excluding the both end portions.

Figure 2:
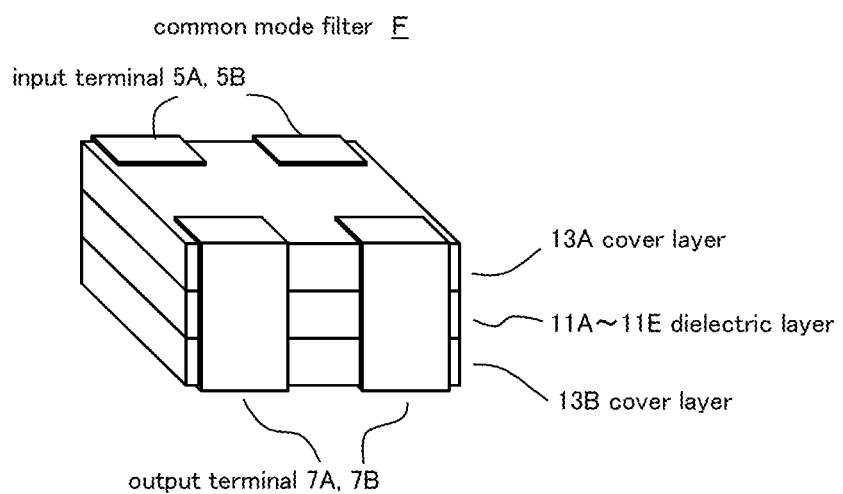
FIG. 2 is an outer appearance view of the common mode filter of FIG. 1.

The outer peripheral end of the signal coil 1A is led out to an edge of the dielectric layer 11A via an input side lead wire 15A formed on the same surface as the dielectric layer 11A, and is connected to an input terminal 5A shown in FIG. 2.

The inner peripheral end of the signal coil 1A is led out to a dielectric layer 11D laminated on the dielectric layer 11C on an opposite side to the dielectric layer 11B interposing a via 21A formed in the dielectric layers 11A, 11B and 11C, and is led out to the edge of the dielectric layer 11D via an output side lead line 17A formed on the dielectric layer 11D which faces the dielectric layer 11C, and is connected to the output terminal 7A shown in FIG. 2. The dielectric layer 11D is almost the same as the dielectric layer 11C.

The outer peripheral end of the signal coil 1B is led out to the edge of the dielectric layer 11C via an input side lead line 15B formed at a position not overlapped on the input side lead line 15A on the same surface as the dielectric layer 11C, and is connected to the input terminal 5B of FIG. 2.

The inner peripheral end of the signal coil 1B is led out to the dielectric layer 11D interposing a via 21B formed in the dielectric layer 11C, and is led out to the edge of the dielectric layer 11D via an output side lead line 17B formed at a different position from the output side lead line 17A on the dielectric layer 11D which faces the dielectric layer 11C, and is connected to an output terminal 7B of FIG. 2.

The control coil 3 is spirally formed in the same winding direction as the signal coils 1A and 1B, but is not formed always in the same line width and the same line space (line pitch) as those of the signal coils 1A and 1B.

The outer peripheral end of the control coil 3 is led out to the dielectric layer 11D interposing a via 21C formed in the dielectric layer 11B and 11C, and is connected to one resistor connecting pad 19B formed at a different position from the output side lead lines 17A and 17B, on the dielectric layer 11D which faces the dielectric layer 11C.

The inner peripheral end of the control coil 3 is led out to the dielectric layer 11D interposing a via 21D formed in the dielectric layer 11B and 11C, and is connected to the other resistor connecting pad 19A formed at a different position from the outside lead lines 17A and 17B and the resistor connecting pad 19B on the dielectric layer 11D which faces the dielectric layer 11C.

An embedded resistor (first embedded resistor) 9 terminating a power induced at the control coil 3, is formed between the resistor connecting pads 19A and 19B.

The embedded resistor 9 is formed by resistive paste printing or a resistance embedded resin substrate, etc. In a case of the resistive paste, it is co-fired with ceramic, and at this time, there is a great variation of a resistance value, and therefore in anticipation of this variation, a print size or a resistivity of the resistive paste are set.

The dielectric layers HA to 11D are laminated, and further a dielectric layer 11E and a cover layer 13A are laminated on the dielectric layer 11A on the opposite side to the dielectric layer 11B, and a cover layer 13B is laminated on the dielectric layer 11D on the opposite side to the dielectric layer 11C, thus integrating the layers by firing, etc. The dielectric layer 11E is almost the same as the dielectric layer 11A.

When the cover layers 13A and 13B are magnetic materials, the dielectric layers 11A to 11E are laminated, pressed, and fired, to become a first solid, and the cover layers 13A and 13B are integrally bonded on this solid.

When the cover layers 13A and 13B are dielectric materials, the cover layers 13A and 13B are disposed above and below the dielectric layers 11A to 11E, which are then integrated by laminating press and firing.

In the common mode filter F integrally formed by any one of the above methods, input terminals 5A and 5B are formed on one outer peripheral side face as external terminal electrodes with input side lead lines 15A and 15B connected thereto, and output terminals 7A and 7B are formed on the other opposed outer peripheral side face as external terminal electrodes with output side lead lines 17A and 17B connected thereto, thus forming the common mode filter F (completed) as a chip component shown in FIG. 2.

Figure 3:
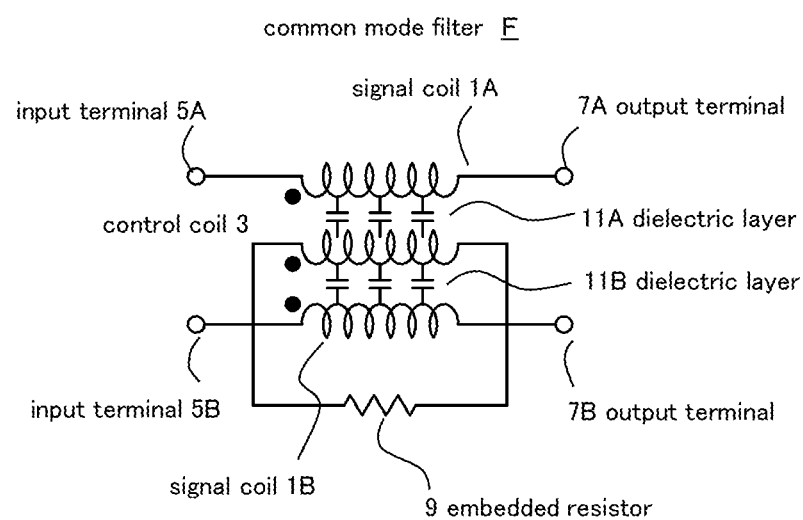
FIG. 3 shows an equivalent circuit of the common mode filter of FIG.

FIG. 3 shows an equivalent circuit of the common mode filter of FIG. 1. A capacitance formed by the dielectric layer 11A and a capacitance formed by the dielectric layer 11B are required to be the same. Therefore, the control coil 3 is formed at a position of an intermediate layer between the signal coils 1A and 1B, and the dielectric layer 11A and the dielectric layer 11B are preferably made of the same material and have the same layer thickness.

In such a configuration, an average potential of the signal coil 1A and the signal coil 1B is applied to the control coil 3, and when a differential signal is inputted to the signal coils 1A and 1B, a positive polarity and a negative polarity are canceled. Therefore the average potential is "zero". Accordingly the control coil 3 is not visible from the differential signal.

On the other hand, a common mode is a state in which both of the signal coils 1A and 1B are simultaneously positive polarity and negative polarity, and the intermediate potential is not "zero". Accordingly an electromagnetic field is applied to the control coil 3, thus generating an induced electromotive force in the control coil 3.

The control coil 3 forms a first feedback loop circuit via the embedded resistor 9 so that a current flows to the first feedback loop circuit due to the generated induced electromotive force, and power is consumed by the embedded resistor 9, and as a result, a common mode noise is absorbed and removed.

When the current induced by the control coil 3 does not flow to the first feedback loop circuit and the power is not consumed by resistance, the common mode noise is not absorbed and removed, resulting in a state in which only one end of the control coil 3 as shown in patent document 2 is connected to a circuit ground. Therefore, the common mode noise is not sufficiently absorbed.

Figure 4:
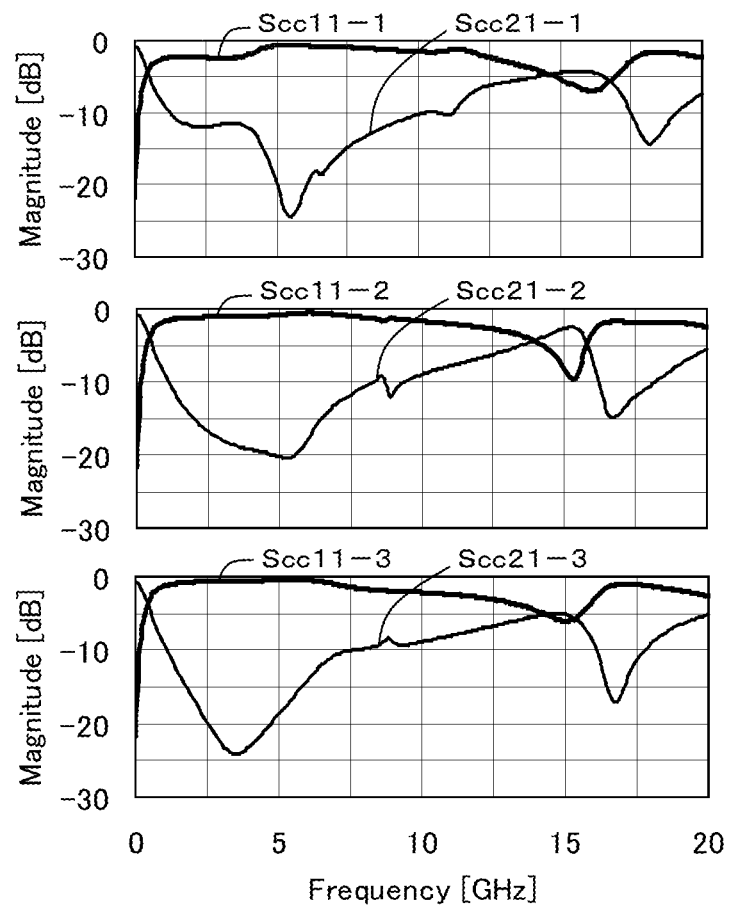
FIG. 4 shows the frequency characteristics of the common mode filter of FIG. 1.

Regarding the common mode filter F of the present invention thus configured, FIG. 4 shows an example of the frequency characteristics obtained by an electromagnetic simulation of the common mode filter F designed for 10 Gbits/second transmission.

FIG. 4 shows common mode signal reflection characteristic Scc11 and common mode signal transmission characteristic Scc21 among plural frequency characteristics. Although differential signal pass characteristic Sdd21 is omitted, −3 dB pass band of Sdd21 is obtained in the frequency range of 20 GHz or more.

In FIG. 4, branch numbers "−1 to −3" are given at the end of reference numeral Scc11 and reference numeral Scc21 respectively. These branch numbers indicate the line width and the line space of each coil, and specifications thereof are as follows.

In the signal coils 1A and 1B, the line width is set to 10 μm, the line space is set to 20 μm for all branch numbers, and setting of the control coil 3 is described below.

Branch number −1: line width: 10 μm, line space: 10 μm
Branch number −2: line width: 10 μm, line space: 20 μm
Branch number −3: line width: 10 μm, line space: 30 μm It is a matter of course that the control coil 3 is disposed at the intermediate position between the signal coils 1A and 1B in the thickness direction, and further dielectric materials 11A to 11C are required to be made of the same material, and also cover layers 13A, 13B and dielectric materials 11D, 11E are made of the same material as the material of the dielectric materials 11A to 11C.

In the abovementioned configuration, when the cover layers 13A and 13B are magnetic materials, the common mode noise removing performance can be slightly improved. However, simultaneously, deterioration of the differential signal transmission characteristics due to magnetic loss also occurs, and the common mode noise removing performance is not improved even at the cost of the differential signal transmission characteristics. Therefore, in the following configuration, cover layers 13A and 13B are all dielectric materials.

In the configuration of the branch number −1 in FIG. 4, there is a high conductor density of the control coil 3, and a sufficient magnetic coupling between the signal coils 1A and 1B cannot be obtained, because a path of a magnetic field is closed between the signal coils 1A and 1B, resulting in slightly larger Scc21 at frequency of 4 GHz or less, namely, the performance of removing the common mode noise is slightly deteriorated. However, the performance of removing the common mode noise at frequency of 5 G to 10 GHz is most excellent.

In the configuration of branch number −2, lines are overlapped in the thickness direction in perspective view between the control coil 3 and the signal coils 1A, 1B, thus providing a space between lines to secure the path of the magnetic field, and therefore the magnetic coupling between the signal coils 1A and 1B is larger than the magnetic coupling in the configuration of branch number −1. Accordingly, in the configuration of branch number −2, Scc21 is more improved at 4 GHz or less, compared to the configuration of branch number −1.

In the configuration of branch number −3, the space of the control coil 3 is largest, and a largest magnetic coupling between the signal coils 1A and 1B can be obtained. Therefore, a peak frequency for removing the common mode noise is shifted to be lower, and the common mode reflection amount Scc11 is largest. Namely, the configuration of branch number −3 is almost the same principle of removing a noise as that of a reflective type, similarly to a conventional common mode choke coil.

Figure 5:
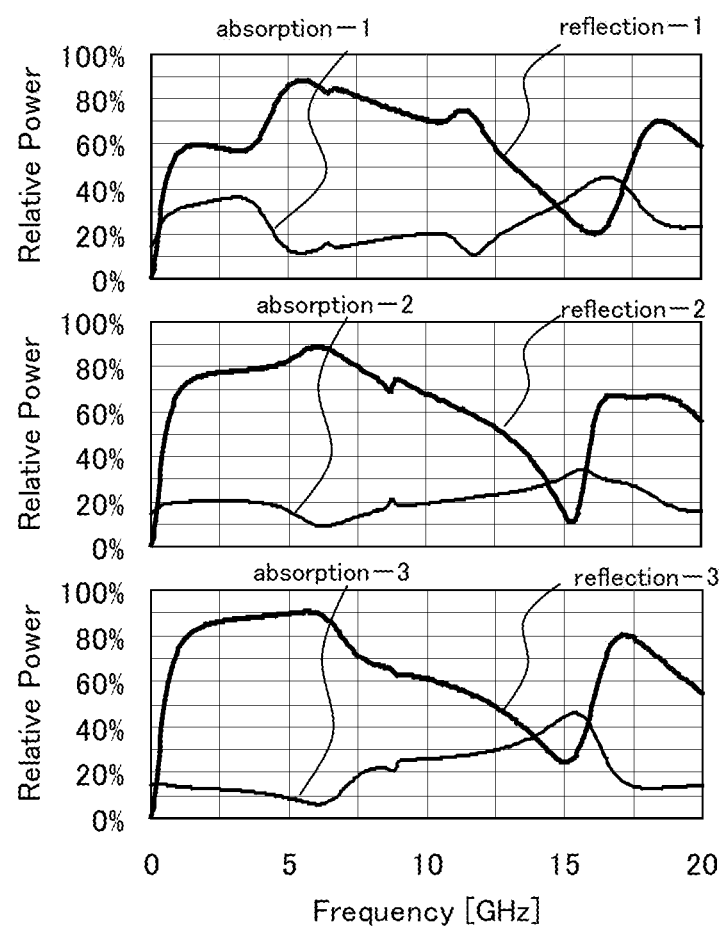
FIG. 5 shows the frequency characteristics of the common mode filter of FIG. 1.

In the abovementioned configuration, in order to clarify a difference of the common mode noise reflection amount, the ratio of a reflection power and the ratio of an internal absorption power are obtained when an input power is set as "100", and results thereof are shown in FIG. 5.

From FIG. 5, it is found that the common mode absorption amount is largest at 5 GHz or less in the configuration of branch number −1, and reversely the common mode absorption amount is smallest at 5 GHz or less in the configuration of branch number −3, and an intermediate amount between them is observed in the configuration of branch number −2.

Accordingly, the abovementioned control coil 3 is configured to control the magnetic coupling between the first and second signal coils 1A and 1B. By disposing the control coil 3, the removed common mode noise is induced in the control coil 3, and is absorbed by the embedded resistor 9. Further, by changing the configuration of the control coil 3, the characteristic of removing and absorbing the common mode noise can also be changed.

In the present invention, as a modification of the configuration other than changing the pitch of the control coil 3, it is conceivable that an outer size is set to be small, or the line width is set to be different from that of the signal coil (the same thing can be said hereafter).

In the description hereafter, the control coil is configured in such a way that the line width and the line space are the same as those of the signal coil, and the lines of these coils are overlapped in the thickness direction in perspective view.

The abovementioned common mode filter F includes:

the signal coil 1A spirally formed in the dielectric layers 11A to 11E of a multilayer structure, and serially inserted and connected to the differential signal line of one polarity;

the signal coil 1B spirally formed in the dielectric layers 11A to 11E so as to be superimposed on the signal coil 1A in the thickness direction and so as to face the signal coil 1A interposing the dielectric layers 11A to 11E, and serially inserted and connected to the differential signal line of the other polarity;

a control coil 3 spirally formed in the dielectric layers 11A to 11E so as to be sandwiched between the first and second signal coils 1A and 1B interposing the dielectric layers 11A to 11E, and wound in the same direction as the signal coil 1A, and configured to control the magnetic coupling between the signal coils 1A and 1B; and the embedded resistor 9 formed in the dielectric layers 11A to 11E and connected to the outer peripheral end and the inner peripheral end of the control coil 3, thus forming the first feedback loop circuit in the dielectric layers 11A to 11E via the control coil 3 and the embedded resistor 9.

Therefore, in the configuration including the signal coils 1A, 1B, and the control coil 3, by disposing the control coil 3, the removed common mode noise is induced in the control coil 3 and can be absorbed by the embedded resistor 9. Further, by changing the shape of the control coil 3, the characteristics of removing and absorbing the common mode noise can also be changed.

Therefore, the magnetic coupling between the signal coils 1A and 1B is controlled by the control coil 3, and the reflection of the common mode noise is suppressed, and the common mode noise of 2 GHz or less can be sufficiently removed.

In addition, the first feedback loop circuit is formed in the dielectric layers 11A to 11E via the control coil 3 and the embedded resistor 9, and therefore the first feedback loop circuit can be formed in the dielectric layers 11A to 11E, and the external connecting configuration can be simplified.

Figure 6:
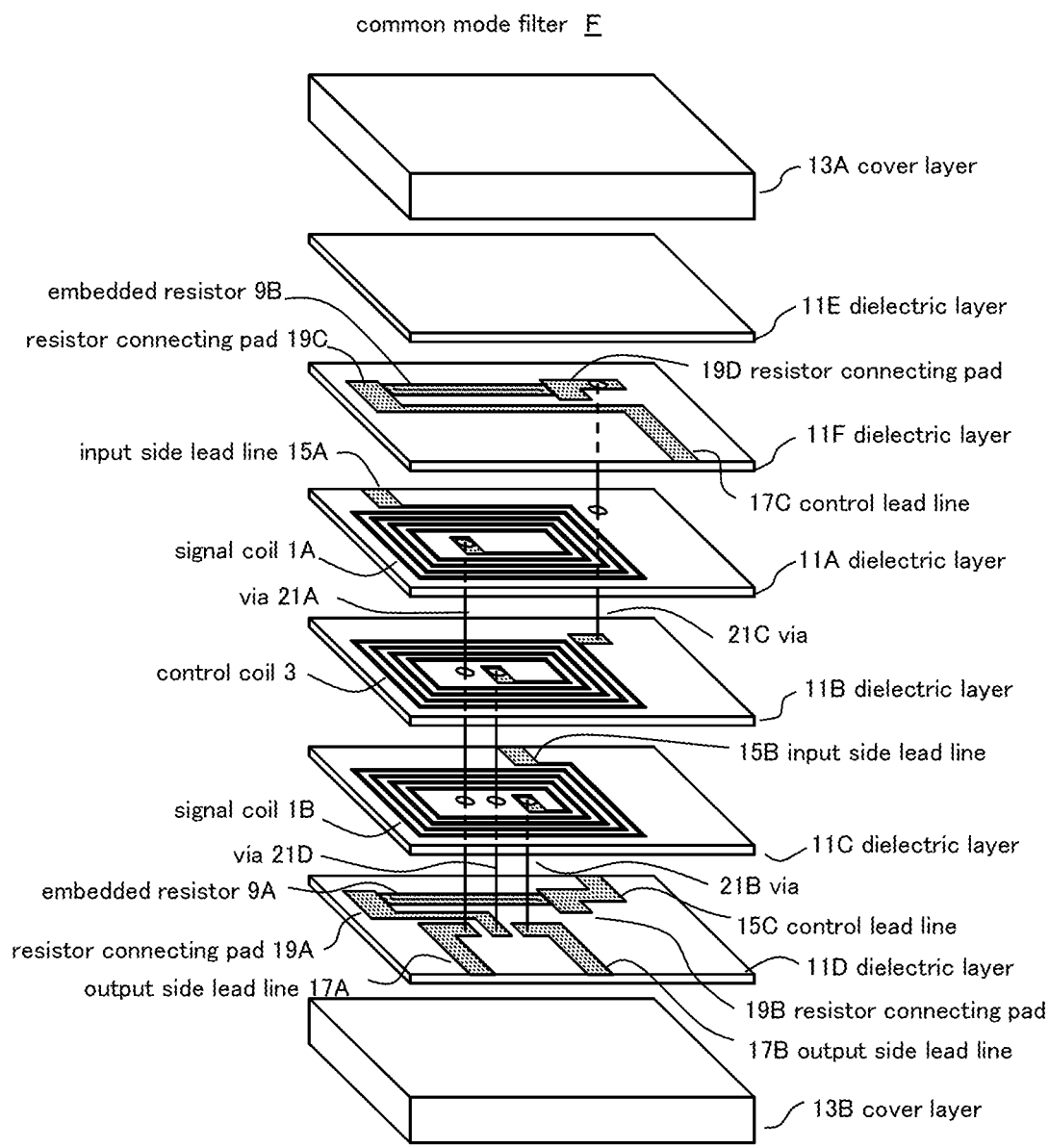
FIG. 6 is an exploded perspective view showing another example of the common mode filter according to the present invention.

FIG. 6 is an exploded perspective view showing another embodiment of the common monde filter F according to the present invention.

In the configuration of FIG. 1, both terminals of the control coil 3 are connected via the embedded resistor 9, thus forming the first feedback loop circuit by the control coil 3 and the embedded resistor 9. On the other hand, in the configuration of FIG. 6, each terminal of the control coil 3 is connected to control lead lines 15C and 17C via separate embedded resistors 9A and 9B, thereby connecting to external terminals. In the configuration of FIG. 6, the embedded resistors 9A and 9B are referred to as first embedded resistors for convenience.

The outer peripheral end of the control coil 3 is connected to a resistor connecting pad 19D interposing the via 21C, the resistor connecting pad 19D being formed on a similar dielectric layer 11F disposed between the dielectric layers 11A and 11E, and the position of the outer peripheral end is also moved to a position where the via 21C is not allowed to approach the signal coil 1A.

The inner peripheral end of the control coil 3 is connected to the resistor connecting pad 19A on the dielectric layer 11D interposing the via 21D, and this point is the same as the configuration of FIG. 1. However, unlike FIG. 1, the resistor connecting pad 19B is connected to the control lead line 15C. Other configuration is almost the same as the configuration of FIG. 1.

In this configuration, the dielectric layer 11F is newly provided, and the resistor connecting pads 19C, 19D, the embedded resistor 9B, and the control lead line 17C are disposed in this dielectric layer 11F. However, if they can be disposed in vacant spaces of the dielectric layers 11A to 11D, there is no necessity for newly providing the dielectric layer 11F.

Figure 7:
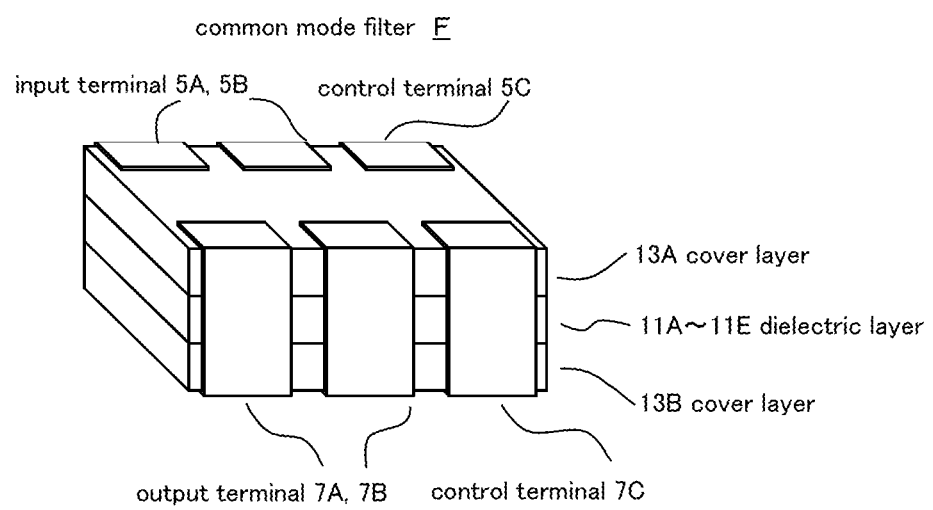
FIG. 7 is an outer appearance view of the common mode filter of FIG. 6.

The abovementioned cover layers 13A, 13B, and the dielectric layers 11A to 11F are integrally formed, laminated, and baked, thus forming the common mode filter F as shown in FIG. 7.

In this common mode filter F, in addition to the input terminals 5A and 5B, a control terminal 5C is formed on one of the outer peripheral side faces, as a first external terminal to which the control lead line 15C is connected, and in addition to the output terminals 7A and 7B, a control terminal 7C is formed on the other outer peripheral side face, which is opposed to the above outer peripheral side face, as a second external terminal to which the control lead line 17C is connected, thus forming the common mode filter F (completed) as a chip component.

The common mode filter F shown in FIG. 6 is configured in such a way that the first feedback loop circuit is formed via the control coil 3 and the embedded resistors 9A and 9B, then the first feedback loop circuit is connected outside of the common mode filter F by externally short-circuiting between the control terminals 5C and 7C or grounding to a circuit ground (not shown).

Figure 8:
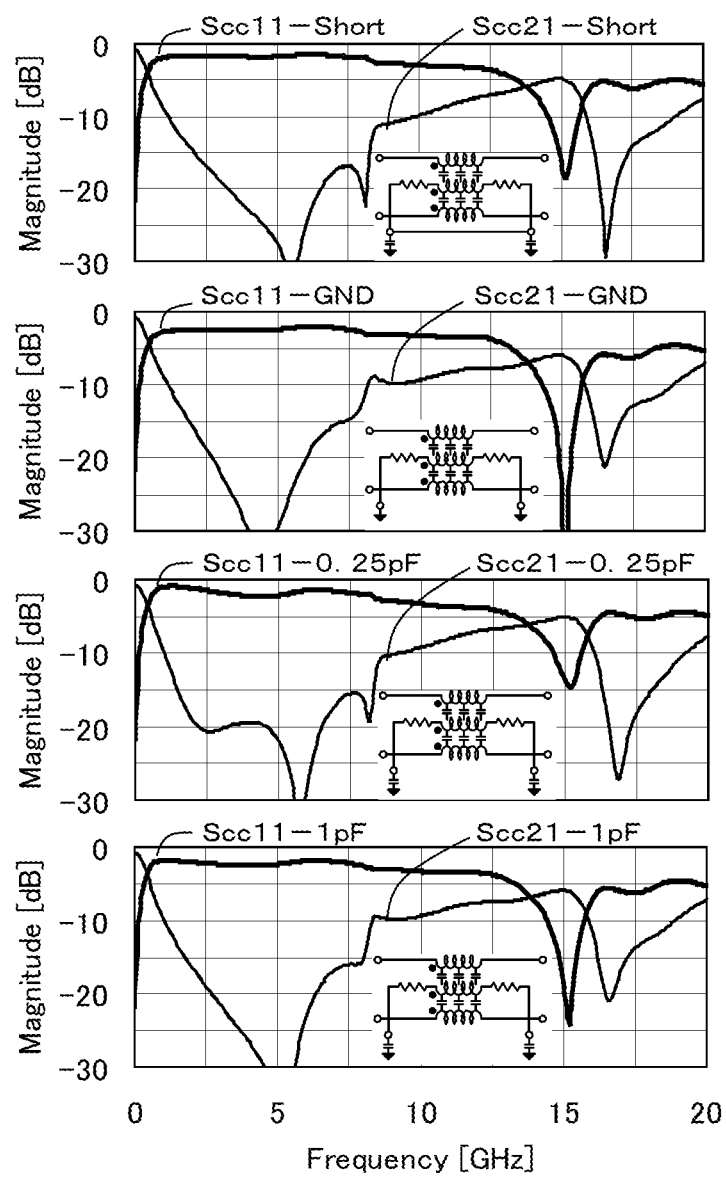
FIG. 8 shows the frequency characteristics of the common mode filter of FIG. 6.

In the common mode filter F of FIG. 6 as well, the line width is set to 10 μm and the line space is set to 20 μm for each signal coil 1A, 1B and the control coil 3, and the frequency characteristic designed for 10 Gbits/second transmission is shown in FIG. 8. The branch numbers in FIG. 8 indicate the following cases.

Branch number −Short: Control terminals 5C and 7C are short-circuited.

Branch number −GND: Control terminals 5C and 7C are both grounded to the circuit ground.

Branch number −Open: Control terminals 5C and 7C are both opened (unconnected)

In FIG. 8, the branch number −Short is supposed to indicate the same configuration as FIG. 1 because the first feedback loop circuit is formed by the control coil 3 directly via the embedded resistors 9A and 9b, and is supposed to coincide the characteristics of branch number −2 in FIG. 4. However, the result is greatly different.

The reason is that the configuration is different as follows: when the common mode filter F having an outer shape of FIG. 7 is mounted on a substrate, control terminals 5C and 7C are soldered to a substrate mounting pad, and a pad capacitance formed between the substrate mounting pad (not shown) and the circuit ground is connected to the control terminals 5C and 7C. An equivalent circuit thereof is shown in the graphs of FIG. 8.

Thus, the common mode noise of the GHz range is transmitted to the pad capacitance and returns to the circuit ground.

Namely, it can be said that the configuration of FIG. 6 is based on the principle which is almost the same as the configuration of patent document 1. While the common mode noise of 2 GHz or less is hardly removed depending on the configuration of patent document 1, it can be removed in the configuration of FIG. 6, therefore it can be said that the configuration of FIG. 6 is more advanced from the configuration of patent document 1.

In the branch number −Short in FIG. 8, the pad capacitance is 0.25 pF. However, two pads are electrically connected each other, thus forming a parallel connection of pad capacitances, and therefore the pad capacitance functions as 0.5 pF in total.

Branch number –GND in FIG. 8 indicates a configuration in which control terminals 5C and 7C are directly electrically connected to the circuit ground, and the circuit ground is used as a route of the first feedback loop circuit, and simultaneously as a return path of the common mode noise which returns to the circuit ground. Branch number –GND indicates the configuration which is almost the same as the principle of patent document 1 rather than branch number –Short, but in this configuration, the common mode noise of 2 GHz or less can be removed similarly to the configuration of branch number –Short, and it can be said that branch number –GND is more advanced from the configuration of patent document 1.

Branch number –Open indicates a configuration in which the control terminals 5C and 7C are used in an open state with connecting nothing thereto. However, this configuration is also the configuration in which pad capacitances in the mounting substrate of 0.25 pF and 1 pF are connected, thus forming the first feedback loop circuit via these pad capacitances, and the common mode noise is transmitted through the pad capacitances and returns to the circuit ground.

When the pad capacitance is 0.25 pF, the amount of removing the common mode noise is slightly smaller at 2.5 G to 5 GHz, than other branch number, but the amount of removing the common mode noise is larger than other configuration of FIG. 1. When the pad capacitance is 1 pF, such a configuration shows almost the same characteristic as the characteristic of the branch number –GND. Therefore when there is such a degree of pad capacitance, this shows almost the same configuration for the common mode signal of GHz range as the configuration of directly connecting the first feedback loop circuit to the circuit ground.

Incidentally, from each reference numeral Scc11 in FIG. 8, a larger attenuation than the attenuation of the reference numeral Scc11 in FIG. 4 can be observed, and it is found that the reflection amount is further suppressed.

Figure 9:
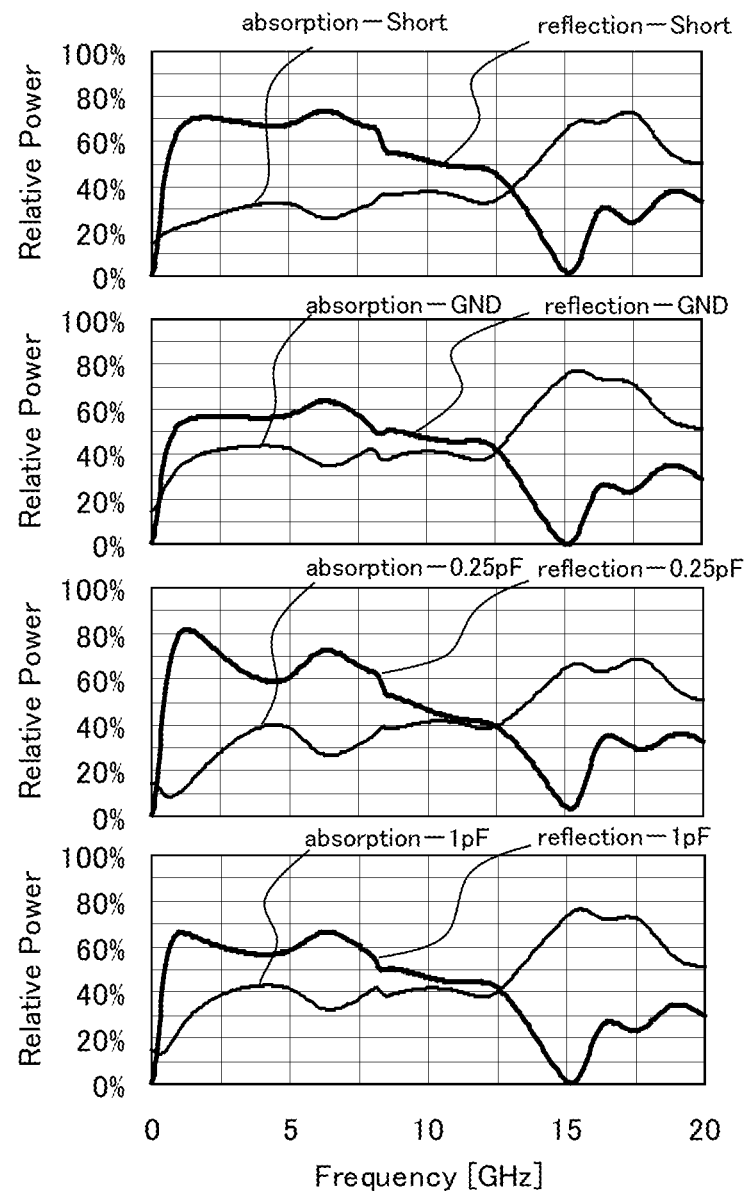
FIG. 9 shows the frequency characteristics of the common mode filter of FIG. 6.

Therefore, similarly to FIG. 5, FIG. 9 shows the ratio of the reflection power, and the ratio of the internal absorption power, when the input power is set to "100". Compared to FIG. 5, an absorption ratio is increased in all branch numbers, and a reflection ratio is decreased accordingly, thus showing an effectiveness of escaping the common mode noise to the circuit ground via the resistor.

Although not shown, the resistor, an inductance, or a series connection circuit or a parallel connection circuit of the resistor and the inductance, etc., may be connected between the control terminals 5C, 7C, and the circuit ground in FIG. 7. However, this does not mean to be a significant performance improvement, and a merit is small in spite of an increased external components.

Thus, the common mode filter F shown in FIG. 6 is formed in such manner that in order to form the first feedback loop circuit, the outer peripheral end of the control coil 3 is connected to the control terminal 5C directly or via the embedded resistor 9B, the control terminal 5C being connected to the external feedback circuit, and the inner peripheral end of the control coil 3 is connected to the control terminal 7C directly or via another embedded resistor 9A, the control terminal 7C being connected to the external feedback circuit, thus forming the first feedback loop circuit, for example, by short-circuiting or capacitance-connecting between the outer terminals.

Even in the case of the common mode filter F thus configured, the magnetic coupling between the first and second signal coils 1A and 1B can be controlled over a wider range via the external first feedback loop circuit, and it is possible to suppress the reflection of the common mode noise and remove the common mode noise of 2 GHz or less.

Figure 10:
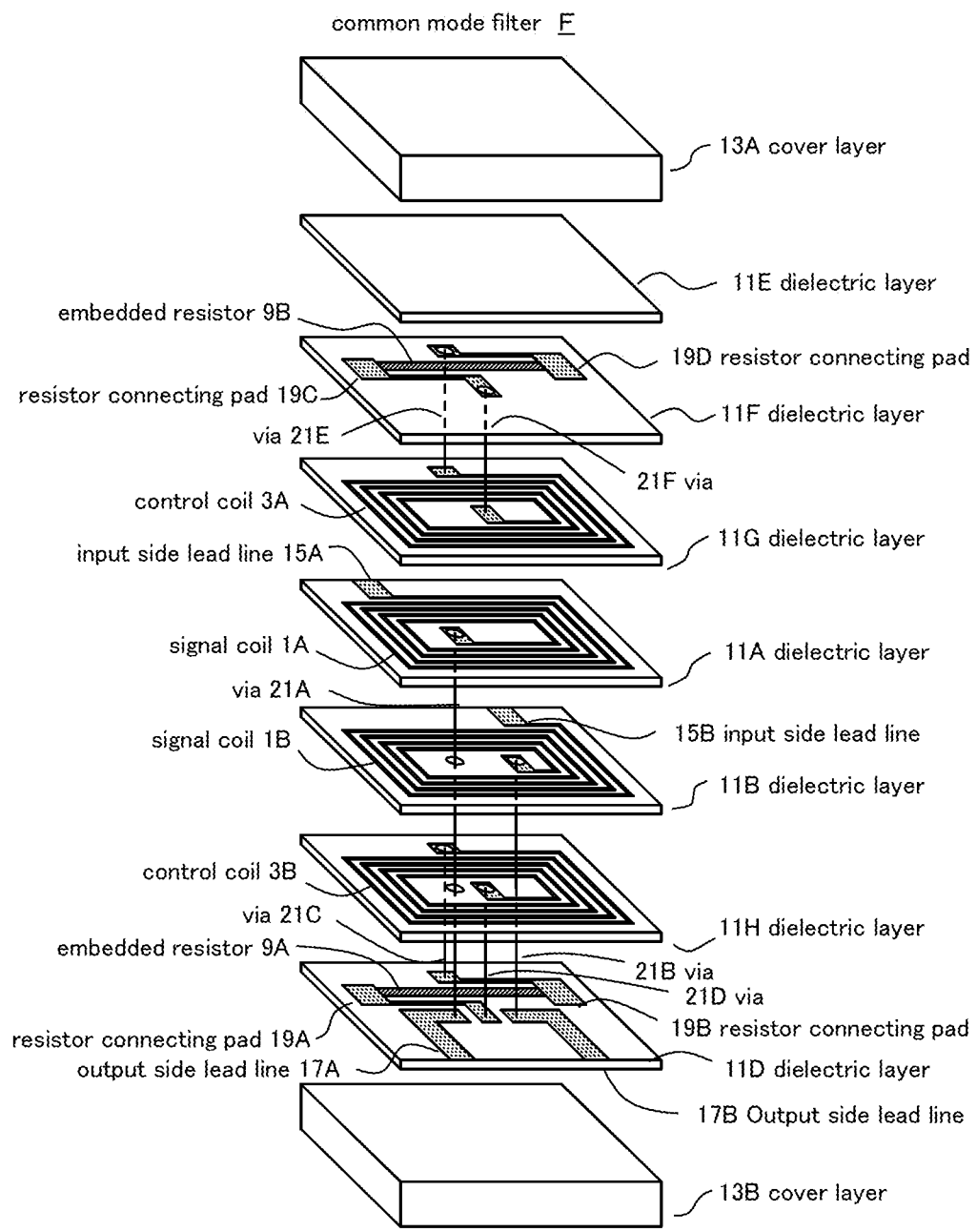
FIG. 10 is an exploded perspective view showing another embodiment of the common mode filter according to the present invention.

FIG. 10 is an exploded perspective view showing another embodiment of the common mode filter F according to the present invention.

In the configuration of FIG. 1, the control coil 3 is sandwiched between the signal coils 1A and 1B. Therefore there is a problem that a passage of the magnetic field is closed, and the magnetic coupling between the signal coils 1A and 1B is weakened.

In order to avoid such a problem, FIG. 10 shows a configuration in which the control coil 3 is not disposed between the signal coils 1A and 1B, but a control coil (second control coil) 3A is disposed on an upper side of the signal coil 1A interposing a dielectric layer 11G, and a control coil (third control coil) 3B is disposed on a lower side of the signal coil 1B interposing a dielectric layer 11H.

Namely, the dielectric layer 11G similar to the dielectric layer 11B of FIG. 1 is disposed between the dielectric layers 11A and 11E, and the control coil 3 is omitted by forming the control coil 3A similar to the control coil 3 of FIG. 1, and the similar dielectric layer 11H is disposed between the dielectric layers 11B and 11D, and the control coil 3B similar to the control coil 3 of FIG. 1 is formed.

Further, both ends of the control coil 3A are connected to the resistor connecting pads 19C and 19D which are formed on the dielectric layer 11F interposing the vias 21E and 21F of the dielectric layer 11F, and an embedded resistor 9B (second embedded resistor) similar to the embedded resistor 9 is formed between the resistor connecting pads 19C and 19D.

Both ends of the control coil 3B are connected to the resistor connecting pads 19A and 19B which are formed on the dielectric layer 11D interposing vias 21C and 21D of the dielectric layer 11H, and an embedded resistor (third embedded resistor) 9A similar to the embedded resistor 9 is formed between the resistor connecting pads 19A and 19B. Other configuration is almost the same as the configuration of FIG. 1.

Figure 11:
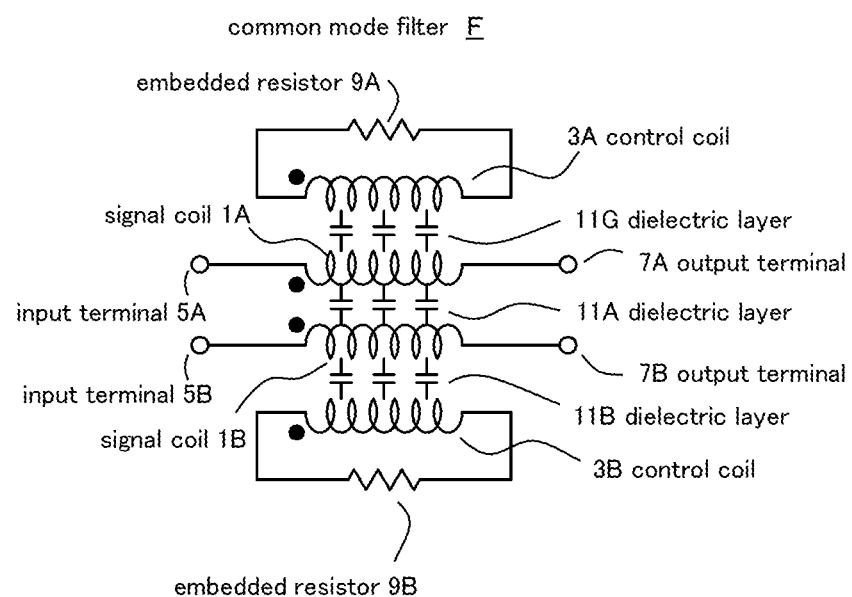
FIG. 11 shows an equivalent circuit of the common mode filter of FIG. 10.

FIG. 11 shows an equivalent circuit of the common mode filter F shown in FIG. 10.

In the configuration of FIG. 10, the second, third feedback loop circuits are separately formed by the control coil 3A, the embedded resistor 9B, the control coil 3B, and the embedded resistor 9A.

An important point here is that the capacitance formed between the signal coil 1B and the control coil 3B with the dielectric layer 11B interposed between them, and the capacitance formed between the signal coil 1A and the control coil 3A with the dielectric layer 11G interposed between them, are required to be the same constant. Therefore, the dielectric layer 11B and the dielectric layer 11G preferably have the same thickness and made of the same material, and the control coils 3A and 3B are required to be formed into approximately the same shape.

Figure 12:
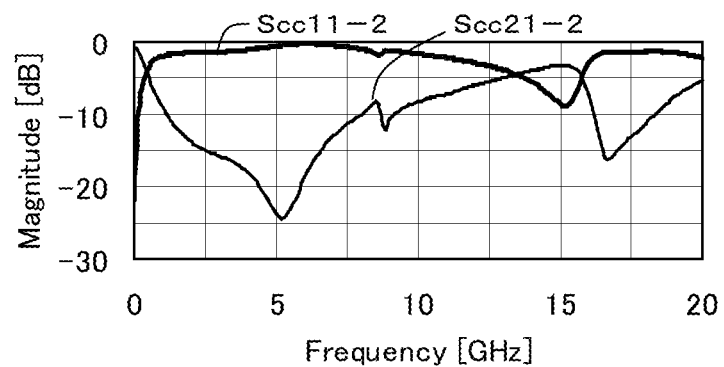
FIG. 12 shows the frequency characteristics of the common mode filter of FIG. 10.

Regarding the common mode filter F thus configured, FIG. 12 shows an example of the frequency characteristics obtained by electromagnetic simulation, when the common mode filter F is designed for the purpose of 10 Gbits/second transmission.

As described above, an interval between the signal coil 1A and the control coil 3A in the thickness direction is set to be the same as an interval between the signal coil 1B and the control coil 3B in the thickness direction so that the capacitance formed by the dielectric layer 11B and the capacitance formed by the dielectric layer 11G are the same constant. The line width is 10 μm and the line space is 20 μm in all coils 1A, 1B, 3A, and 3B respectively.

Figure 14:
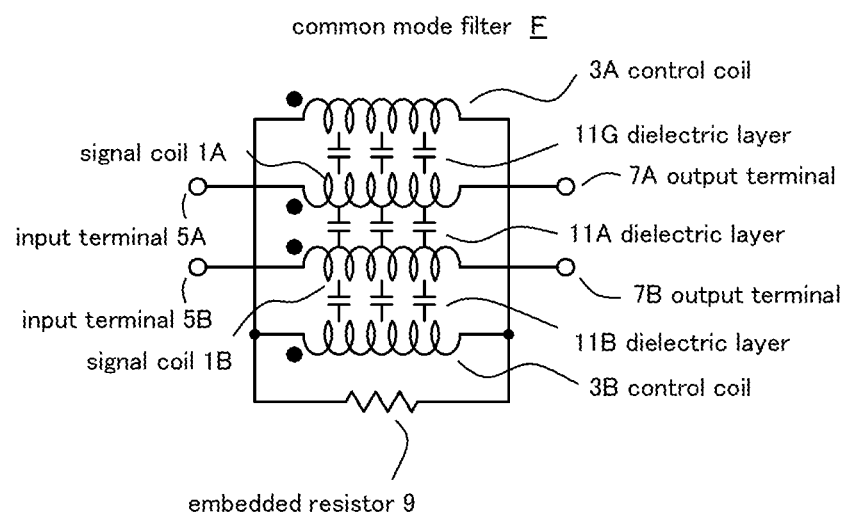
FIG. 14 shows an equivalent circuit of the common mode filter of FIG. 13.

Accordingly, in order to confirm the advantage over the configuration of FIG. 1, it is preferable to compare the branch number −2 shown in FIG. 3 and FIG. 14.

As a result, it is found that the amount of removing the common mode noise is larger in the configuration of FIG. 10, by about 5 dB at frequency of 5 GHz. However, this means that the number of layers is increased by two layers to improve the removing amount by 5 dB, and it can be said that the configuration of FIG. 1 is not inferior to the configuration of FIG. 12 when cost effectiveness is taken into consideration.

Such a common mode filter F shown in FIG. 10 is capable of controlling the magnetic coupling between the signal coils 1A and 1B by the control coils 3A and 3B and suppressing the reflection of the common mode noise, and sufficiently removing the common mode noise of 2 GHz or less, with a satisfactory magnetic coupling maintained between the signal coils 1A and 1B in the configuration including the signal coils 1A, 1B, and the control coils 3A, 3B.

In addition, since the second and third feedback loop circuits are formed via the control coils 3A, 3B, and the embedded resistors 9A, 9B, the second and third feedback loop circuits can be configured in the dielectric layer, and the external connecting configuration is simplified.

Further, in the common mode filter F of FIG. 10 as well, similarly to the abovementioned configuration, in order to form the second and third feedback loop circuits, the outer peripheral end and the inner peripheral end of the control coils 3A and 3B, are connected to the abovementioned control terminals 5C and 7C directly or via the second and third embedded resistors 9A and 9B, the control terminals 5C and 7C being connected to the external feedback circuits (referred to as third and fourth external terminals for convenience), thus forming the second and third feedback loop circuits via the control terminals 5C and 7C. Therefore, the magnetic coupling between the first and second signal coils can be controlled, and the reflection of the common mode noise can be suppressed, and the common mode noise of 2 GHz or less can be removed over the wider range via the external second and third feedback loop circuits.

Figure 13:
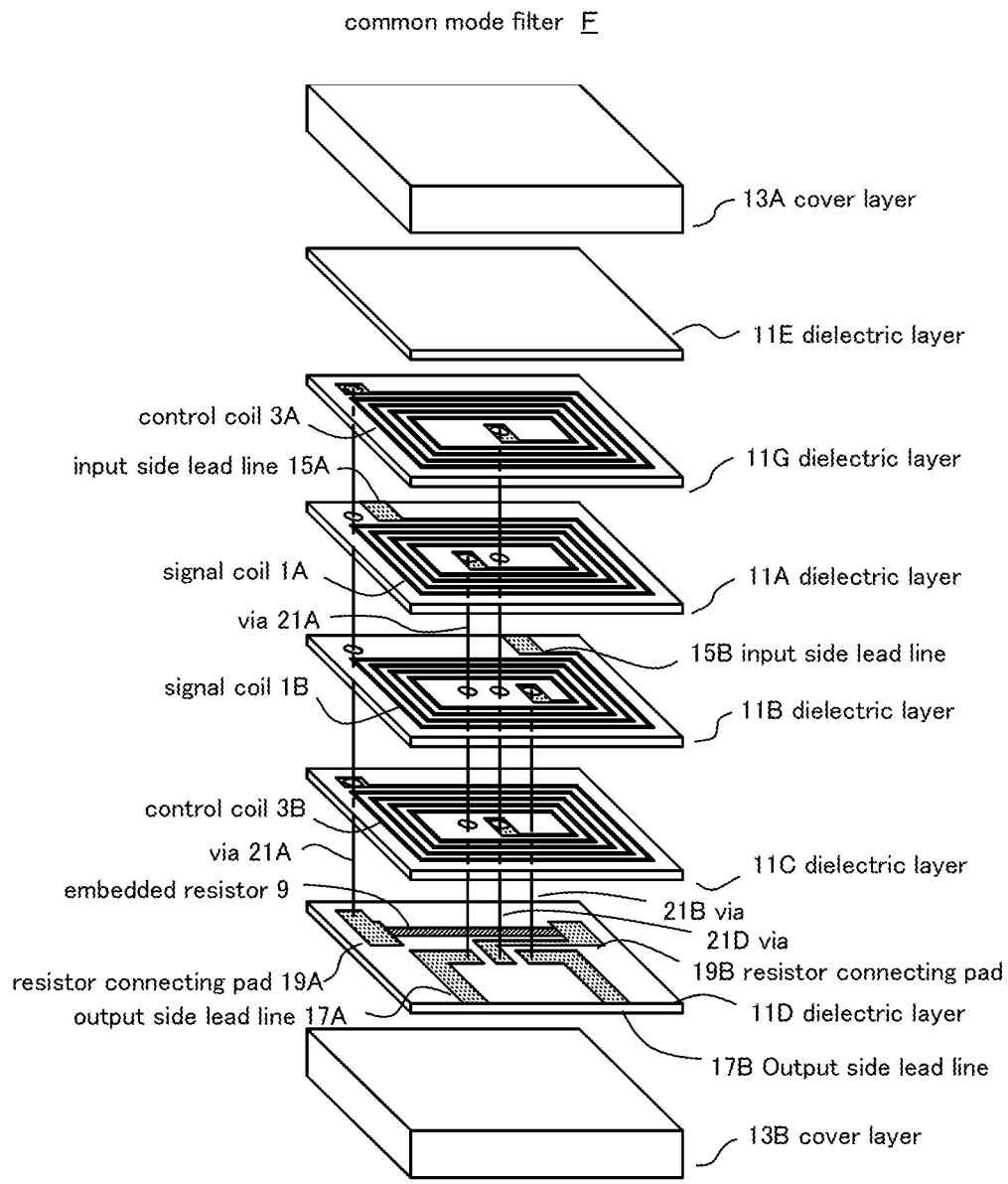
FIG. 13 is an exploded perspective view showing another embodiment of the common mode filter according to the present invention.

FIG. 13 is an exploded perspective view showing another embodiment of the common mode filter F of the present invention.

In the configuration of FIG. 13, if compared to the configuration of FIG. 10 the inner peripheral ends and the outer peripheral ends of the control coils (fourth and fifth control coils) 3A and 3B are connected in parallel by vias 21C and 21D, and the fourth feedback loop circuit of the control coils 3A and 3B is formed via the embedded resistor (fourth embedded resistor) 9 on the dielectric layer 11D, thus not requiring the dielectric layer 11F and an electrode pattern thereon. In addition, the fourth feedback loop circuits are formed on the dielectric layers 11A to 11E.

In this configuration as well, almost the same characteristic as the characteristic of FIG. 12 can be obtained. However, as described above, it is necessary to devise a pattern design so as to prevent the following situation: the vias 21C and 21D connected to the dielectric layer 11D from the outer peripheral ends of the control coils 3A and 3B, approaches the signal coils 1A and 1B to cause a short-circuit between them.

FIG. 14 is an equivalent circuit view of the common mode filter F shown in FIG. 13.

In FIG. 14 as well, the similar effect can be obtained, as the effect obtained in the abovementioned configurations.

Further, although not shown, the following configuration can also be considered: the inner peripheral ends of the control coils 3A and 3B are via-connected, and meanwhile the outer peripheral ends are not via-connected, and the embedded resistor 9 is electrically connected between the outer peripheral end of the control coil 3A and the outer peripheral end of the control coil 3B, to thereby form the feedback loop circuit.

In this configuration, a current flowing into the embedded resistor 9 from the control coil 3, and a current flowing into the embedded resistor 9 from the control coil 3B, are reversed. Therefore, each other's current is canceled in the embedded resistor 9, thus not causing power consumption in the embedded resistor 9, and the reflection of the removed noise is reduced.

Figure 15:
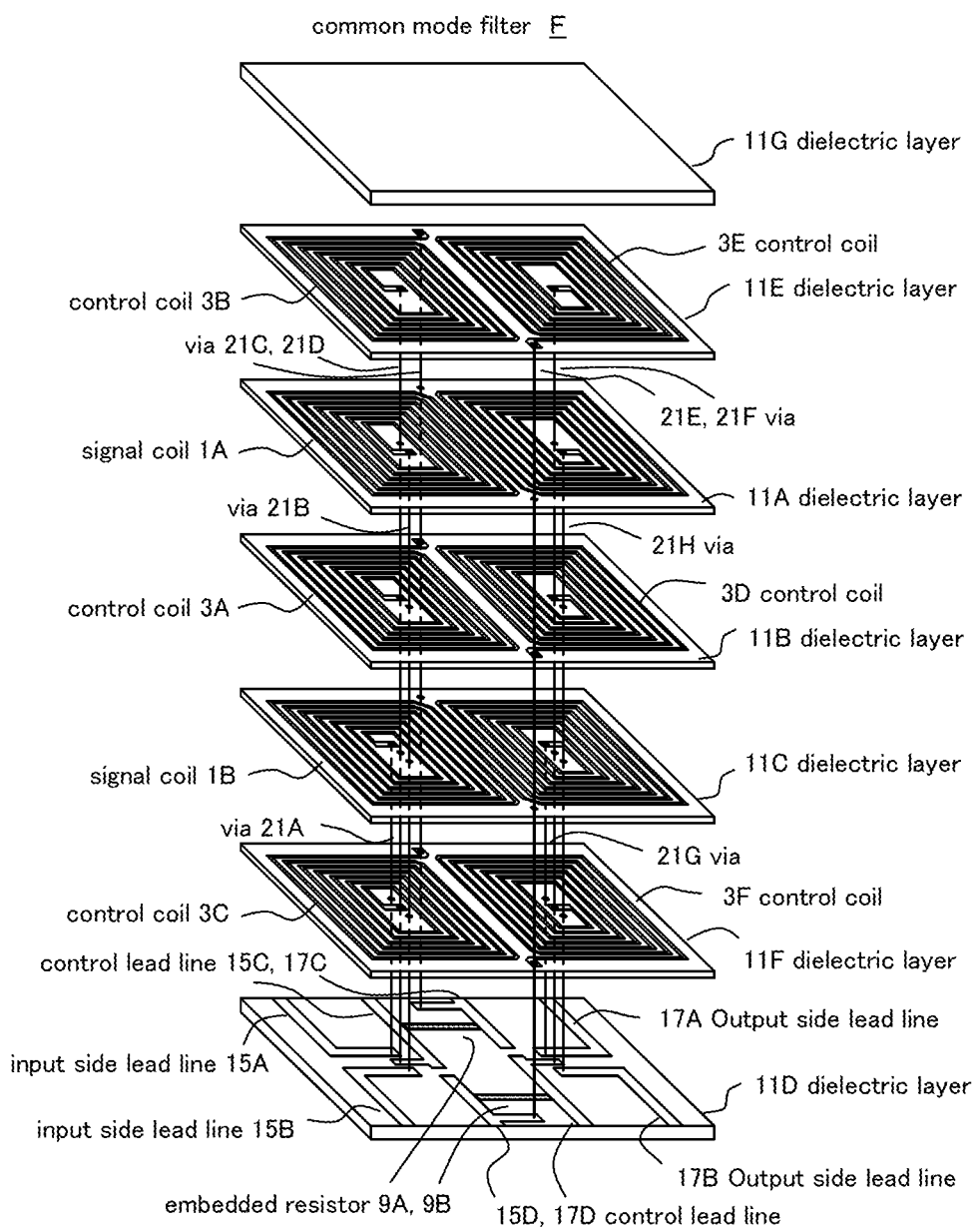
FIG. 15 is an exploded perspective view showing another embodiment of the common mode filter according to the present invention.

FIG. 15 is an exploded perspective view showing another embodiment of the common mode filter F according to the present invention.

In the common mode filter F shown in FIG. 15, the signal coil 1A is formed in the dielectric layer 11A, and the signal coil 1B is formed in the dielectric layer 11C. However, in each dielectric layer 11A, 11C, the signal coils 1A and 1B are formed by connecting the outer peripheral ends of two same coils placed in point symmetry in one dielectric layer.

In the signal coils 1A and 1B, the input side inner peripheral ends are connected to vias 21A and 21B, and the output side inner peripheral ends are connected to vias 21G and 21H.

Control coils (sixth control coils) 3A and 3D having the same shape as the shape of the signal coils 1A and 1B, are placed on the dielectric layer 11B at an intermediate position between the signal coils 1A and 1B, so as to be the point symmetry in the dielectric layer 11B. However, the outer peripheral ends of the control coils 3A and 3D are not connected to each other, but are independently connected to vias 21C and 21E. Similarly, the inner peripheral ends are connected to vias 21D and 21F.

The control coils 3B and 3E having the same shapes as the shapes of the control coils 3A and 3D, are formed in the dielectric layer HE disposed on an upper side of the dielectric layer 11A, and control coils 3C and 3F having the same shapes as the shapes of the control coils 3A and 3D, are formed in the dielectric layer 11F disposed on a lower side of the dielectric layer 11C, and the outer peripheral ends of them are connected to vias 21C and 21E, and the inner peripheral ends of them are connected to vias 21D and 21F. In the configuration of FIG. 15, the control coils 3A to 3F are referred to as sixth control coils for convenience. Other configuration is almost the same as the abovementioned configurations of FIG. 1, FIG. 6, FIG. 10, and FIG. 13.

The vias 21A and 21B connected to the signal coils 1A and 1B, are connected to the input side signal lead lines 15A and 15B which are disposed on the dielectric material 11D of a lowermost layer, and the vias 21G and 21H connected to the signal coils 1A and 1B are connected to the output side signal lead lines 17A and 17B which are disposed on the dielectric material 11D, and the vias 21C, 21D, 21E, and 21F connected to the control coils 3A to 3F are connected to the control lead lines 17C, 15C, 15D, and 17D which are disposed on the dielectric material 11D.

Control lead lines 17C, 15C, 15D, and 17D also serve as the resistor connecting pad, in which the embedded resistor 9A is connected between the control lead lines 15C and 17C, and the embedded resistor 9B is connected between the control lead lines 15D and 17D. In the configuration of FIG. 15, these embedded resistors 9A and 9B are referred to as fifth embedded resistors for convenience.

In addition to these dielectric layers 11A to 11F, the uppermost layer is also covered by the dielectric material 11G, and they are laminated and integrally fired. After integration, terminal electrodes are formed so as to cover a cross-sectional face of each signal lead line and control lead line, to thereby form the common mode filter F having a chip shape shown in FIG. 16.

Figure 16:
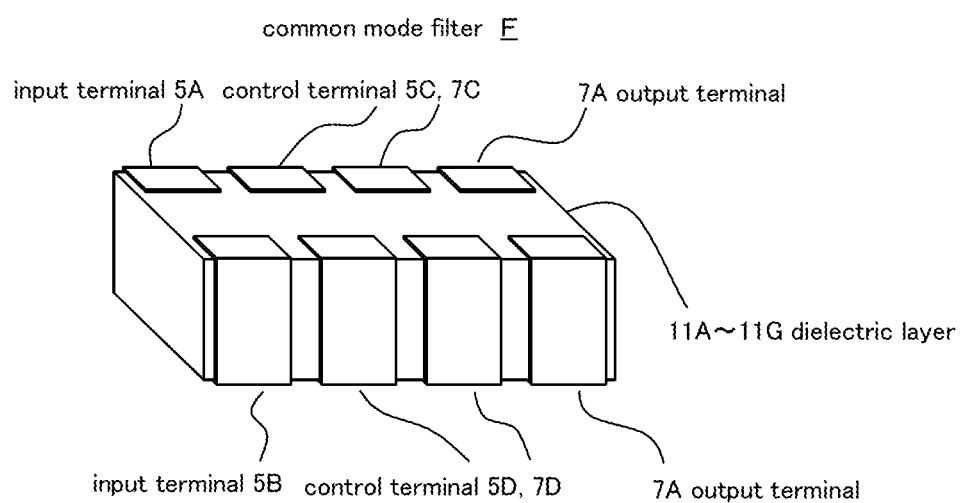
FIG. 16 is an outer appearance view of the common mode filter of FIG. 15.

In FIG. 16, control terminals 5C and 7C are connected to the output side lead lines 15C and 17C, and control terminals 5D and 7D are connected to the output side lead lines 15D and 17D.

The fifth feedback loop circuit is sometimes formed separately by connecting the external feedback circuit (not shown) to the control terminals 5C and 7C, and another external feedback circuit (not shown) is connected to the control terminals 5D and 7D. The fifth feedback loop circuit can also be formed in the dielectric layers 11A to 11F.

Figure 17:
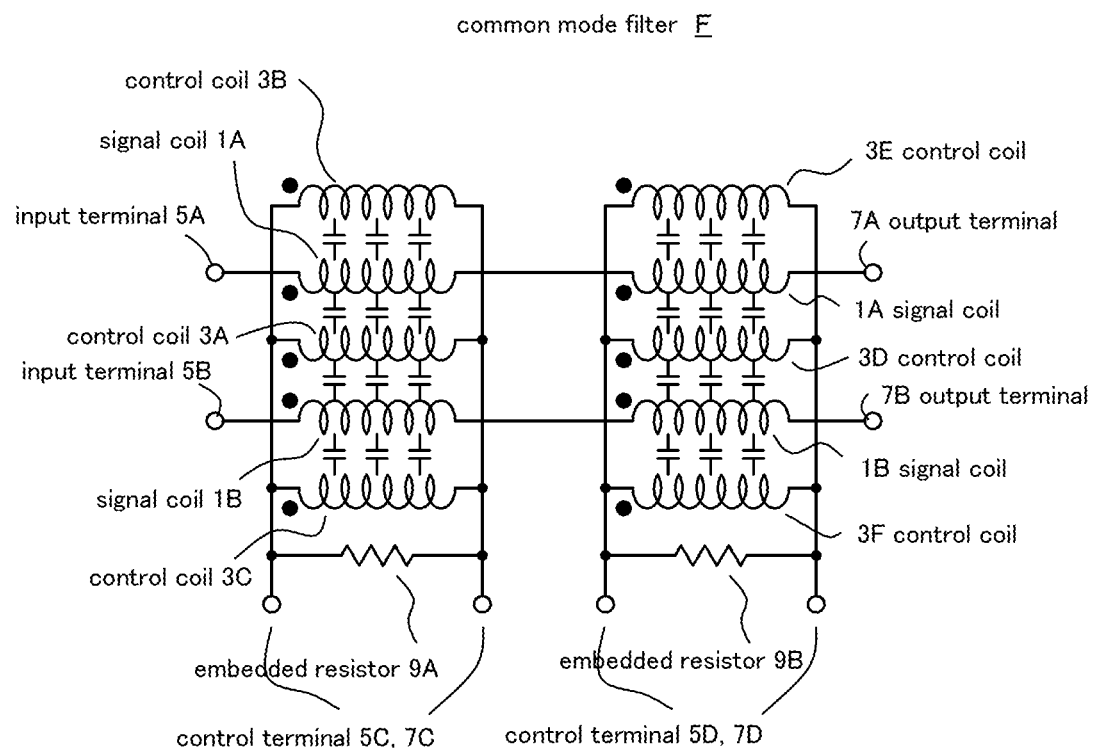
FIG. 17 shows an equivalent circuit of the common mode filter of FIG. 15.

FIG. 17 shows an equivalent circuit of the common mode filter F having the configuration of FIG. 15.

As clarified from FIG. 17, the control coils 3A to 3F are disposed on a layer between the signal coils 1A and 1B, and are also disposed on an upper and lower layer of the signal coils 1A and 1B, thus increasing the capacitance formed in each dielectric layer. Accordingly, characteristic impedance for the differential signal or a normal mode signal formed by the single coils 1A and 1B becomes lower.

Generally, a differential mode characteristic impedance of the common mode filter for differential signals is 90 to 100 Ohms. However, the common mode filter F of FIG. 15 is intended to have a normal mode characteristic impedance of 50 Ohms.

The reason is that when propagating a weak signal through a coaxial cable of 50 Ohms (not shown), common mode currents flow through a shield wire of the coaxial cable, with the earth as a common ground, which causes a noise problem in some cases, and removal of the common mode noise is necessary. One of such applications is a magnetic resonance imaging apparatus (MRI).

MRI involves a problem of the common mode noise, because a weak resonance signal is detected. However, the common mode filter using magnetic materials cannot be used because it disturbs a magnetic field, and therefore the common mode current is suppressed by a balun on which the coaxial cable is wound, or a lattice type LC circuit.

The common mode filter F of FIG. 15 provides a common mode filter not using the magnetic materials as an alternative of such a balun, and as clarified from FIG. 15, all layers are constituted of non-magnetic dielectric layers.

Figure 18:
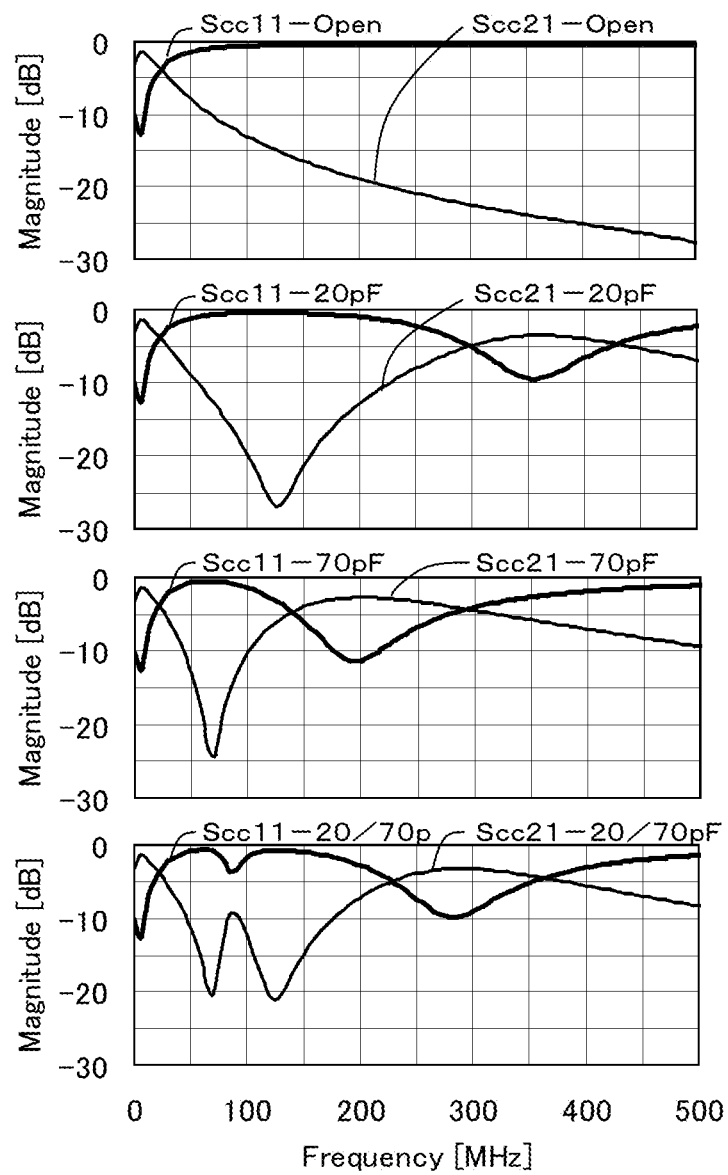
FIG. 18 shows the frequency characteristics of the common mode filter of FIG. 15.
Figure 19:
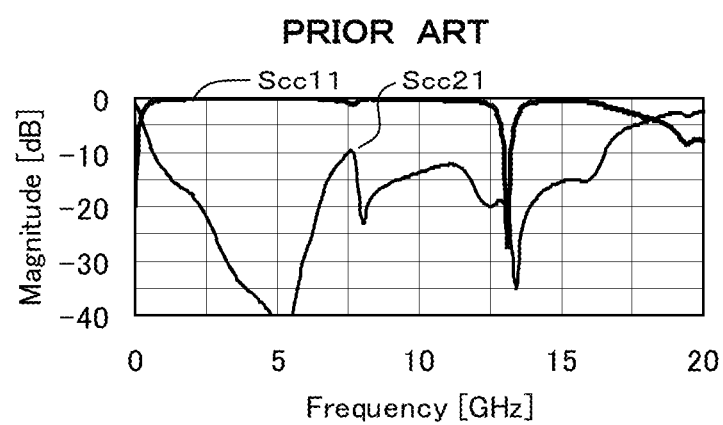
FIG. 19 shows the frequency characteristics of a conventional common mode filter.

In such a configuration, FIG. 18 shows the characteristics by performing the electromagnetic simulation, when the line width is set to 50 μm, and the line space is set to 100 μm in all coils 1A, 1B, and 3A to 3E. Here, coaxial cables of 50Ω are connected to the input terminals 5A and 5B, and the output terminals 7A and 7B of FIG. 16. Each branch number indicates connection states to the control terminals 5C, 5D, 7C, 7D.

Branch number –Open: all control terminals are opened (unconnected)

Branch number –18 pF: capacitance of 18 pF is connected between control terminals 5C and 7C, and between 5D and 7D Branch number –70 pF: capacitance of 70 pF is connected between control terminals 5C and 7C, and between 5D and 7D Branch number –20 pF/70 pF: capacitance of 20 pF is connected between control terminals 5C and 7C, and capacitance of 70 pF is connected between 5D and 7D Broad common mode removing characteristics are obtained during open of the total control terminals, and a common mode removing peak is around 128 MHz in the configuration of the branch number –18 pF, and a common mode removing peak is around 64 MHz in the configuration of the branch number –70 pF, and both common mode peaks of 64 MHz and 128 MHz can be obtained in the configuration of the branch number –20 pF/70 pF.

In MRI, resonance frequencies generated from a human body is determined by a local strength of a magnetic field applied to the human body, and in the MRI having a standard magnetic field strength 1.5 Tesla, the resonance frequency is 64 MHz, and in the latest MRI having the magnetic field strength 3.0 Tesla, the resonance frequency is 128 MHz.

Then, it is found that the common mode filter F of the present invention has an optimal configuration for MRI, having a maximum common mode removing peak in the above resonance frequencies.

As described above, each control coil is disposed in the layer between the signal coils 1A and 1B and in the upper and lower layers of the signal coils 1A and 1B. However, when a normal mode impedance can be set to a desired value, the control coil may be disposed only in the layer between the signal coils 1A and 1B as shown in FIG. 1, or the control coil may be disposed only in the upper and lower dielectric layers of the signal coils 1A and 1B as shown in FIG. 5.

Further, in FIG. 15, two coils of the same shape are disposed in one dielectric layer in point symmetry. However, the point symmetry is not always required.

Originally, there is no necessity for providing two coils in the present invention. In the example shown in FIG. 15, two coils structure is shown for presenting an example of forming the common mode noise removing peak by two frequencies indicated by branch number –20 pF/70 pF.

Further, such two coils are not necessarily required to be disposed in the same dielectric layer, and for example the configurations of FIG. 1 or FIG. 6 may be superimposed in multiple stages in the thickness direction.

Further, when a metal having high resistivity such as nichrome or tantalum, etc., is used for a conductor of the control coil, including the abovementioned configurations of FIG. 1, FIG. 6, FIG. 10, FIG. 13, and FIG. 15, the value of the embedded resistor can be reduced accordingly, and in an extreme case, it is also acceptable that the embedded resistor is set to "zero Ω", namely, the embedded resistor is omitted and instead conductors are used for connection.

DESCRIPTION OF SIGNS AND NUMERALS 1A, 1B Signal coil (first and second signal coil)
3, 3A, 3B, 3C, 3D, 3E, 3F Control coil (first to sixth control coil)
5A, 5B Input terminal
5C, 5D, 7C, 7D Control terminal (first to fourth external terminal)
7A, 7B Output terminal
9, 9A, 9B Embedded resistor (first to fifth embedded resistor)
11A, 11B, 11C, 11D, 11E, 11F, 11G, 11H Dielectric layer
13A, 13B Cover layer 15A, 15B Input side lead line
17A, 17B Output side lead line
15C, 15D, 17C, 17D Control lead line
19A, 19B, 19C, 19D Resistor connecting pad
21A, 21B, 21C 21D 21E, 21F, 21G, 21H Via
F Common mode filter

The invention claimed is:

1. A common mode filter, comprising:
a first signal coil spirally formed in a dielectric layer of a multilayer structure, and serially inserted and connected to a differential signal line of one polarity;
a second signal coil spirally formed in the dielectric layer so as to be superimposed on the first signal coil in a thickness direction and so as to face the first signal coil interposing the dielectric layer, and serially inserted and connected to a differential signal line of the other polarity;
a first control coil spirally formed in the dielectric layer so as to be sandwiched between the first and second signal coils interposing the dielectric layer, and wound in the same direction as the first signal coil, and configured to control magnetic coupling between the first and second signal coils
a first embedded resistor formed in the dielectric layer and connected to at least one of an outer peripheral end or an inner peripheral end of the first control coil; and
the first control coil and the first embedded resistor form a first feedback loop circuit.

2. The common mode filter according to claim 1, wherein the first feedback loop circuit is formed in the dielectric layer.

3. The common mode filter according to claim 1, wherein the outer peripheral end of the first control coil is connected to a first external terminal directly or via the first embedded resistor, the first external terminal being connected to an external feedback circuit, and the inner peripheral end of the first control coil is connected to a second external terminal directly or via another first embedded resistor, the second external terminal being connected to the external feedback circuit, and the first feedback loop circuit is electrically connected between the first external terminal and second external terminal.

4. A common mode filter, comprising:
a first signal coil spirally formed in a dielectric layer of a multilayer structure, and serially inserted and connected to a differential signal line of one polarity;
a second signal coil spirally formed in the dielectric layer so as to be superimposed on the first signal coil in a thickness direction and so as to face the first signal coil interposing the dielectric layer, and serially inserted and connected to a differential signal line of the other polarity;
a second control coil spirally formed in the dielectric layer so as to face the first signal coil interposing the dielectric layer on an opposite side to the second signal coil, and wound in the same direction as the first signal coil, and configured to control magnetic coupling between the first and second signal coils;
a third control coil spirally formed in the dielectric layer so as to face the second signal coil interposing the dielectric layer on the opposite side to the first signal coil, and wound in the same direction as the first signal coil, and configured to control magnetic coupling between the first and second signal coils;
a second embedded resistor formed in the dielectric layer, and connected to at least one of an outer peripheral end or an inner peripheral end of the second control coil,
a third embedded resistor formed in the dielectric layer, and connected to at least one of an outer peripheral end or an inner peripheral end of the third control coil; and
the second control coil and second embedded resistor form a second feedback loop circuit and the third control coil and third embedded resistor form a third feedback loop circuit.

5. The common mode filter according to claim 4, wherein the second feedback loop circuit and the third feedback loop circuit are formed in the dielectric layer.

6. The common mode filter according to claim 4, wherein the outer peripheral end of the second control coil is connected to a second external terminal directly or via the second embedded resistor, the second external terminal being connected to an external feedback circuit, and the inner peripheral end of the second control coil is connected to a third external terminal directly or via another second embedded resistor, the third external terminal being connected to the external feedback circuit, and a second feedback loop circuit is electrically connected between the second and third external terminals, and the outer peripheral end of the third control coil is connected a fourth external terminal directly or via a third embedded resistor, the fourth external terminal being connected to an external feedback circuit, and the inner peripheral end of the third control coil is connected to a fifth external terminal directly or via another third embedded resistor, the fifth external terminal being connected to the external feedback circuit, and a third feedback loop circuit is electrically connected between the fourth and fifth external terminals.

7. A common mode filter, comprising:
a first signal coil spirally formed in a dielectric layer of a multilayer structure, and serially inserted and connected to a differential signal line of one polarity;
a second signal coil spirally formed in the dielectric layer so as to be superimposed on the first signal coil in a thickness direction and so as to face the first signal coil interposing the dielectric layer, and serially inserted and connected to a differential signal line of the other polarity;
a fourth control coil spirally formed in the dielectric layer so as to face the first signal coil interposing the dielectric layer on an opposite side to the second signal coil, and wound in the same direction as the first signal coil, and configured to control magnetic coupling between the first and second signal coils;
a fifth control coil formed in the dielectric layer so as to face the second signal coil interposing the dielectric layer on an opposite side to the first signal coil, and wound in the same direction as the first signal coil, and configured to control magnetic coupling between the first and second signal coils; and
a fourth embedded resistor formed in the dielectric layer, and connected to at least one of an outer peripheral end or an inner peripheral end of the fourth and fifth control coils,
wherein the fourth and fifth control coils are connected in parallel, the fourth embedded resistor and the fourth and fifth control coils form a fourth feedback loop circuit.

8. The common mode filter according to claim 7, wherein the fourth feedback loop circuit is formed in the dielectric layer.

9. A common mode filter, comprising:
a first signal coil spirally formed in a dielectric layer of a multilayer structure, and serially inserted and connected to a differential signal line of one polarity;

a second signal coil spirally formed in the dielectric layer so as to be superimposed on the first signal coil in a thickness direction and so as to face the first signal coil interposing the dielectric layer, and serially inserted and connected to a differential signal line of the other polarity;

a sixth control coil spirally formed in the dielectric layer so as to sandwich the first or second signal coil and so as to face the first or the second signal coil interposing the dielectric layer, and wound in the same direction as the first signal coil, and configured to control magnetic coupling between the first and second signal coils; and a fifth embedded resistor formed in the dielectric layer and connected to a plurality of sixth control coils, wherein the plurality of sixth control coils are connected in parallel, the fifth embedded resistor and the plurality of sixth control coils form a fifth feedback loop circuit.

10. The common mode filter according to claim 9, wherein the fifth feedback loop circuit is formed in a dielectric layer.

\* \* \* \* \*